US009894771B2

(12) United States Patent
Fjelstad

(10) Patent No.: US 9,894,771 B2
(45) Date of Patent: Feb. 13, 2018

(54) OCCAM PROCESS FOR COMPONENTS HAVING VARIATIONS IN PART DIMENSIONS

(76) Inventor: Joseph Charles Fjelstad, Maple Valley, WA (US)

( * ) Notice: Subject to any disclaimer, the term of this patent is extended or adjusted under 35 U.S.C. 154(b) by 521 days.

(21) Appl. No.: 13/228,826

(22) Filed: Sep. 9, 2011

(65) Prior Publication Data
US 2011/0315302 A1  Dec. 29, 2011

Related U.S. Application Data

(60) Continuation-in-part of application No. 13/081,384, filed on Apr. 6, 2011, and a continuation-in-part of
(Continued)

(51) Int. Cl.
*B32B 37/10* (2006.01)
*B32B 37/12* (2006.01)
(Continued)

(52) U.S. Cl.
CPC ........... *H05K 1/189* (2013.01); *B32B 37/153* (2013.01); *H01L 24/29* (2013.01); *H01L 24/32* (2013.01); *H01L 24/83* (2013.01); *H01L 24/93* (2013.01); *H01L 25/0655* (2013.01); *H05K 3/284* (2013.01); *B32B 37/12* (2013.01); *B32B 2307/202* (2013.01); *B32B 2457/08* (2013.01); *B32B 2519/02* (2013.01); *H01L 2224/29* (2013.01); *H01L 2224/2919* (2013.01); *H01L 2224/2929* (2013.01); *H01L 2224/29101* (2013.01); *H01L 2224/29299* (2013.01); *H01L 2224/48465* (2013.01);
(Continued)

(58) Field of Classification Search
CPC ........................... H05K 5/064; H05K 13/0046
See application file for complete search history.

(56) References Cited

U.S. PATENT DOCUMENTS 4,635,356 A    1/1987  Ohuchi
5,222,305 A *  6/1993  Guth ............................ 33/614
(Continued)

OTHER PUBLICATIONS

Sea, T.Y.; Tan, T.C.; Peh, E.K.; , "Reflowable anisotropic conductive adhesives for flipchip packaging ," Electronic Packaging Technology Conference, 1997. Proceedings of the 1997 1st , vol., No., pp. 259-262, Oct. 8-10, 1997 doi: 10.1109/EPTC.1997.723919 URL: http://ieeexplore.ieee.org/stamp/stamp.jsp?tp=&arnumber=723919 &isnumber=15635.*
(Continued)

*Primary Examiner* — Michael N Orlando
*Assistant Examiner* — Marta S Dulko
(74) *Attorney, Agent, or Firm* — Edward P Heller, III

(57) ABSTRACT

An Occam process (solderless manufacturing) that employs a component support fixture that provides permanent or temporary support for components during subsequent processing in a solderless process for electrically connecting the components to circuits. The component support fixture provides oversized compartments for housing the components which may have varying sizes. The compartments are provided with vent holes or apertures for venting air or excess glue as the component support is pressed against the components during manufacture.

2 Claims, 1 Drawing Sheet

Related U.S. Application Data application No. 12/170,426, filed on Jul. 9, 2008, said application No. 13/081,384 is a division of application No. 12/163,870, filed on Jun. 27, 2008, now Pat. No. 7,926,173, which is a continuation-in-part of application No. PCT/US2008/063123, filed on May 8, 2008.

(60) Provisional application No. 61/381,399, filed on Sep. 9, 2010, provisional application No. 60/959,148, filed on Jul. 10, 2007, provisional application No. 60/962,627, filed on Jul. 31, 2007, provisional application No. 60/928,467, filed on May 8, 2007, provisional application No. 60/932,200, filed on May 29, 2007, provisional application No. 60/958,385, filed on Jul. 5, 2007, provisional application No. 60/962,626, filed on Jul. 31, 2007, provisional application No. 60/963,822, filed on Aug. 6, 2007, provisional application No. 60/966,643, filed on Aug. 28, 2007, provisional application No. 61/038,564, filed on Mar. 21, 2008, provisional application No. 61/039,059, filed on Mar. 24, 2008.

(51) Int. Cl.

| | | |
|---|---|---|
| *B32B 37/02* | (2006.01) | |
| *B32B 37/14* | (2006.01) | |
| *H05K 1/18* | (2006.01) | |
| *B32B 37/15* | (2006.01) | |
| *H01L 23/00* | (2006.01) | |
| *H01L 25/065* | (2006.01) | |
| *H05K 3/28* | (2006.01) | |
| *H05K 3/00* | (2006.01) | |

(52) U.S. Cl.
CPC ............ *H01L 2224/83001* (2013.01); *H01L 2224/838* (2013.01); *H01L 2224/83191* (2013.01); *H01L 2224/83385* (2013.01); *H01L 2924/00013* (2013.01); *H01L 2924/014* (2013.01); *H01L 2924/01013* (2013.01); *H01L 2924/01033* (2013.01); *H01L 2924/01082* (2013.01); *H01L 2924/0665* (2013.01); *H01L 2924/14* (2013.01); *H01L 2924/15151* (2013.01); *H01L 2924/15153* (2013.01); *H01L 2924/15165* (2013.01); *H01L 2924/3025* (2013.01); *H05K 3/007* (2013.01); *H05K 2201/066* (2013.01); *H05K 2201/10719* (2013.01); *H05K 2203/0156* (2013.01); *H05K 2203/0173* (2013.01); *H05K 2203/1469* (2013.01)

(56) References Cited

U.S. PATENT DOCUMENTS

| | | | |
|---|---|---|---|
| 5,452,182 A * | 9/1995 | Eichelberger et al. | 361/749 |
| 5,734,555 A | 3/1998 | McMahon | |
| 5,886,415 A * | 3/1999 | Akagawa | 257/789 |
| 2001/0043513 A1* | 11/2001 | Grupp | 368/281 |
| 2002/0168797 A1* | 11/2002 | DiStefano et al. | 438/106 |
| 2003/0057544 A1 | 3/2003 | Nathan | |
| 2007/0023488 A1* | 2/2007 | Lawlyes et al. | 228/180.22 |
| 2007/0035015 A1 | 2/2007 | Hsu | |
| 2007/0102803 A1 | 5/2007 | Gann | |
| 2009/0008140 A1* | 1/2009 | Fjelstad | 174/260 |
| 2009/0017264 A1* | 1/2009 | Fjelstad | 428/172 |
| 2009/0026656 A1* | 1/2009 | Bautista et al. | 264/272.17 |

OTHER PUBLICATIONS

Zhong, Z.; Wong, S.; , "Flip chip on board mounting processes using anisotropic conductive adhesives and eutectic solder," Electronics Packaging Technology Conference, 1998. Proceedings of 2nd , vol., No., pp. 76-82, Dec. 8-10, 1998 doi: 10.1109/EPTC.1998.755982 URL: http://ieeexplore.ieee.org/stamp/stamp.jsp?tp=&arnumber=755982&isnumber=16369.*

K. Gilleo, (1995) "Assembly with Conductive Adhesives", Soldering & Surface Mount Technology, vol. 7 Iss: 1, pp. 12-17 10.1108/eb037885.*

EP Application No. 08756454.8, European Search Report dated Mar. 21, 2012.

* cited by examiner

OCCAM PROCESS FOR COMPONENTS HAVING VARIATIONS IN PART DIMENSIONS

This application is a non provisional of and claims the benefit of provisional application No. 61/381,399 filed Sep. 09,2010; and is a continuation-in-part of U.S. application Ser. No. 13/081,384, filed Apr. 06,2011, which is a divisional application of application Ser. No. 12/163,870, filed Jun. 27,2008, now U.S. Pat. No. 7,926,173,which is a continuation-in-part and claims the benefit of PCT Application No. PCT/US08/63123 filed on May 8, 2008 which claimed priority to: "ELECTRONIC ASSEMBLY WITHOUT SOLDER," U.S. Application No. 60/928,467, filed on May 8, 2007; "ELECTRONIC ASSEMBLY WITHOUT SOLDER AND METHODS FOR THEIR MANUFACTURE," U.S. Application No. 60/932,200, filed on May 29, 2007;"SOLDERLESS FLEXIBLE ELECTRONIC ASSEMBLIES AND METHODS FOR THEIR MANUFACTURE," U.S. Application No. 60/958,385, filed on Jul. 5, 2007;"ELECTRONIC ASSEMBLIES WITHOUT SOLDER AND METHODS FOR THEIR MANUFACTURE," U.S. Application No. 60/959,148, filed on Jul. 10, 2007; "MASS ASSEMBLY OF ENCAPULSATED ELECTRONIC COMPONENTS TO A PRINTED CIRCUIT BOARD BY MEANS OF AN ADHESIVE LAYER HAVING EMBEDDED CONDUCTIVE JOINING MATERIALS," U.S. Application No. 60/962,626, filed on Jul. 31, 2007; "SYSTEM FOR THE MANUFACTURE OF ELECTRONIC ASSEMBLIES WITHOUT SOLDER," U.S. Application No. 60/963,822, filed on Aug. 6, 2007; "ELECTRONIC ASSEMBLIES WITHOUT SOLDER AND METHODS FOR THEIR MANUFACTURE," U.S. Application No. 60/966,643, filed on Aug. 28, 2007; "MONOLITHIC MOLDED SOLDERLESS FLEXIBLE ELECTRONIC ASSEMBLIES AND METHODS FOR THEIR MANUFACTURE," U.S. Application No. 61/038,564, filed on Mar. 21, 2008; and "THE OCCAM PROCESS SOLDERLESS ASSEMBLY AND INTERCONNECTION OF ELECTRONIC PACKAGES," U.S. Application No. 61/039,059, filed on Mar. 24, 2008; all of which are hereby incorporated by reference.

This application further is a continuation-in-part of co-pending U.S. application Ser. No. 12/170,426 filed Jul. 09,2008; which application claims the benefit of U.S. provisional application No. 60/959,148 filed Jul. 10,2007 and U.S. provisional application No. 60/962,627, filed Jul. 31,2007; all of which are hereby incorporated by reference in their entirety.

FIELD OF THE INVENTION

The present invention relates to the field of solderless assembly of packaged components, sometimes known as an Occam process.

BACKGROUND OF THE INVENTION

The present invention is an improvement on an Occam process generally described in U.S. Pat. No. 7,926,173, a grandparent of the present application, which is expressly incorporated by reference. That patent describes the process of placing components on a flexible substrate, adhering the components to the substrate with an insulating material, placing a component support fixture over the components to support them while processing the flexible substrate to provide electrical connections to the components. The components support may be temporary or it may be removed.

While the component support fixture described in the aforementioned patent contains "compartments" of various sizes for different size components, there is no consideration of how to accommodate particular components that have ranges of sizes. If a component is too large in the vertical direction, for example, the component support fixture will not entirely fit over the component such that the support itself will not contact the flexible substrate it is intended to support during subsequent processing of the flexible substrate.

SUMMARY OF THE INVENTION

The invention comprises providing component-receiving compartments in the component support fixture of slightly larger dimensions than the largest dimension of the particular type of component. Invention further provides adhesively bonding the component support fixture to the components using an applied adhesive. The invention further provides a vent hole or aperture into the compartment whereby excess adhesive may be extruded through the vent hole or aperture in the case of oversized components. The invention further provides that components be placed on an adhesive substrate, rather than being adhered to an otherwise non-adhesive substrate via a post-placement adhesive (insulating material). Suitable tooling holes may be employed in the adhesive substrate to better locate the placement of the components.

Another feature of the present invention is that the component support fixture comprises a machined or molded lid for both housing in compartments the components and for adhesively supporting the adhesive layer on a machined surface for subsequent processing of the adhesive layer in an Occam process.

Additionally, the substrate adhesive itself may be anisotropically conductive, such that a foil, adhered to the adhesive, may be patterned into conductive traces as provided by co-pending parent U.S. patent application Ser. No. 12/170, 426 filed Jul. 09,2008,which is hereby incorporated by reference.

DETAILED DESCRIPTION OF THE PREFERRED EMBODIMENTS

Figure 1:
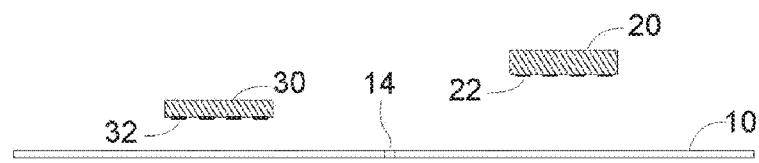
FIG. 1 illustrates a first step in the process showing to components of two different vertical dimensions before their placement on an adhesive substrate.

Referring to FIG. 1, a pair of components 20 and 30 of different vertical heights are shown floating above and adhesive substrate 10 prior to being placed upon the adhesive substrate 10. The adhesive substrate may be supported on a flat surface as is conventional, and may itself be a laminate of one or more layers of, for example metal foil 12, see FIG. 2, and an adhesive layer 10. The adhesive itself is preferably selected from a group consisting of low tack, pressure sensitive acrylic and thermal release films or tapes for hard substrate such as Nitto Denko material NWS-Y5V/NWS-TS322F Each of the components, which may have different vertical heights (and lengths and widths), are package integrated circuits having formed thereon electrical contacts 22 and 32 that will physically contact the adhesive substrate 10. While illustrated in the figure as contacts spaced about the bottom surfaces of the components 20 and 30, the contacts could be of the gullwing, J-leaded or other lead shape variety as illustrated in the aforementioned U.S. Pat. No. 7,926,173. See e.g. FIGS. 8 and 9 of U.S. '173, and the gullwing components 802.

The adhesive may be provided with tooling holes 14 that may be used to provide apertures for tools to better align the adhesive substrate and the tooling, not shown, that physically places the components 20 and 30 on the adhesive substrate 10.

Figure 2:
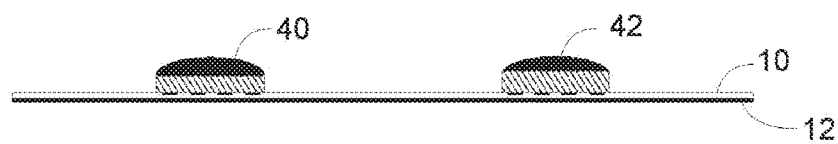
FIG. 2 illustrates a further step in the process wherein adhesive is placed on top of the components after they have been placed on the adhesive substrate.

Referring to FIG. 2, the figure illustrates the components 20 and 30 after they are accurately placed on the adhesive substrate 10. In this step, a metal layer 12 may be applied to the adhesive substrate 10. In subsequent processing, provided the surfaces of the carrier 70 are non conductive this metal layer 12 may be patterned the form electrical traces to the contacts 22 and 32 of the components 20 and 30 as illustrated either in U.S. '173, which shows connections through vias through the adhesive substrate or in co-pending application Ser. No. 12/170,426wherein the electrical connection is due to the adhesive itself being anisotropically conductive such as 3M 5363 an anisotropic conductive film which is comprised of a mixture of epoxy and acrylic resins and a curative in combination with conductive particles dispersed within the mixture so as to be conductive in the Z or vertical axis and insulating in the X and Y directions Alternatively to applying the metal foil layer 12 in step two (FIG. 2), the adhesive substrate 10 may itself comprise a laminate structure consisting of the adhesive substrate 10 and the metal foil 12.

Again referring to FIG. 2, an adhesive is applied to the top surfaces of components 20 and 30, resulting in a piled layer of adhesive 42 and 40 respectively. While the amount of the adhesive in a pile might be within defined ranges, as known in the art, the amount can vary from sample to sample. For this reason, both the vertical height of the components 20 and 30 and the amount of adhesive in piles 42 and 40 may vary within tolerance ranges.

Figure 3:
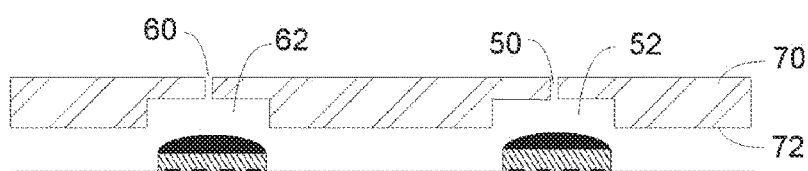
FIG. 3 illustrates a further step in the process wherein a component fixture having aligned compartments is arranged above the components with adhesive already placed on their top surfaces.

Referring to FIG. 3, a component support fixture 70 having compartments 50 and 52 is shown arranged above components 30 and 20 prior to the fixture being lowered into place. As illustrated in the figure, each of the compartments 50 and 52 additionally has a vent hole or aperture 60 and 62. The purpose of a vent hole or aperture is to allow venting both of air and of excess adhesive from the respective compartments 50 and 52 as the component support fixture 70 is lowered into place about components 30 and 20 and is pressed into abutment (not shown) with the adhesive substrate 10 as illustrated in FIG. 4.

Figure 4:
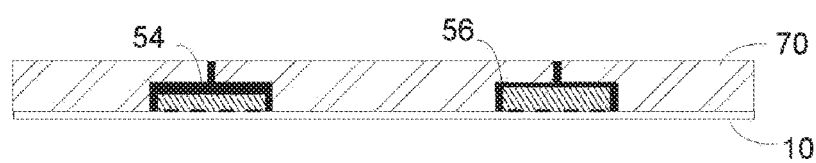
FIG. 4 illustrates a further step in the process where the component fixture has been pressed against the adhesive substrate and wherein excess adhesive has been extruded through a vent hole or aperture from the compartments.

As illustrated in FIG. 4, the size of the compartments 50 and 52 is chosen such that they can accommodate components of all sizes in the both the vertical and horizontal ranges and allow space both above and to the sides of the components 30 and 20 within the compartment 50 and 52. The size is further chosen such that the pile of adhesive 40 or 42 is squeezed about the components 30 and 20 within the compartments 50 and 52. When the size of the components versus the size of the compartments is such that there is insufficient space remaining within the compartments for the excess adhesive, the vent hole or aperture provides for the extrusion of adhesive 40 and 42 through vent holes or apertures 60 and 62, as the component support fixture 70 is pressed down until its bottom surface 72 is pressed into contact with the adhesive substrate 10.

Referring to FIG. 4, the figure shows the component support fixture 70 in place, contacting the adhesive layer 10 via its lower surface 72. As well, the piles of adhesive 40 and 42 have been squeezed into the spaces 54 and 56 between the components 30 and 20 and the compartments 50 and 52. At this point, the adhesive could be allowed to be cured, at which time electrical contacts could be made according to the aforementioned co-pending applications to provide via connections to the contacts 32, 22, or traces by etching the metal foil 12 as provided in Ser. No. 12/170,426.

Figure 5:
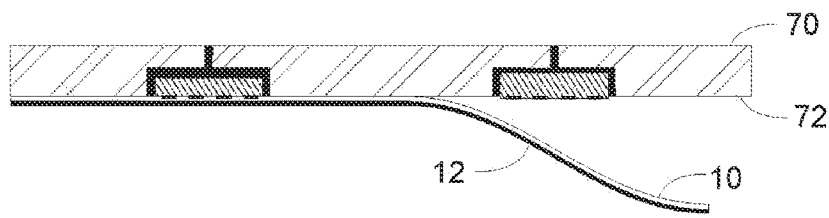
FIG. 5 illustrates a further step of the process showing the removal of the adhesive substrate.

Referring to FIG. 5, in an alternative embodiment, the adhesive 10 could be removed by for example chemical stripping or peeling it from the completed component support fixture/component, as shown in the figure. To facilitate removal the material could be a heat releasable material as mentioned earlier. This is preferentially accomplished by providing the adhesive with a layer 12, which could be the metal foil layer 12 as described above, but it also could be any other suitable layer that would support the adhesive layer during the previous processing steps. Such a suitable layer could be any of various stable polymer films which could serve as a carrier for the adhesive including polyester, polyethelyne napthalate or polyimide.

Figure 6:
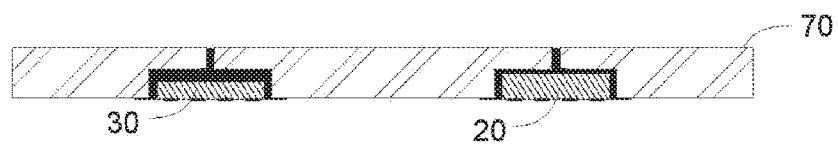
FIG. 6 illustrates a completed part after the removal of the adhesive substrate.

Referring to FIG. 6, the completed part is shown after the adhesive layer 10 has been removed. This part may be used in subsequent manufacturing steps where the components 30 and 20 could be further processed using an Occam process or otherwise to provide electrical connections to other elements on a circuit board. Also, it is intended that the adhesive 40 or 42 be chosen such that the component support fixture 70 might be removed entirely after such subsequent processing.

For this purpose, it is understood that the component support fixture 70 can be made of any material for the purpose sense if invites only temporary manufacturing support for the components 30 and 20. If however component support fixture 70 is intended to be permanent, it could be made of a material that is insulating or conductive depending on the purpose for the support, and it further could be made out of a material having a high thermal conductivity, such as aluminum. Examples of materials in the latter category include epoxy glass laminates or molded thermoplastic materials such as PEEK.

The description of the various embodiments above are not to be taken as a limitation on the scope of the invention. Variations of materials and structures and sequence of steps to achieve the overall objective of providing a component support fixture with vent holes or apertures either as a partial step in an Occam process, or as a completed structure in an Occam process, or other process, is within the scope of the present invention.

I claim:
1. A process comprising:
   placing components having at least two heights or two widths or both defining a size range on an anisotropic adhesive substrate, wherein the anisotropic adhesive substrate comprises an adhesive film consisting of an anisotropic adhesive that is conductive in a direction vertical to the plane of the adhesive film, the adhesive film adhered to a metal foil; each component having at least one lead that contacts the substrate, the components adhesively attached to the anisotropic adhesive substrate without solder;

coating the components with an insulating material;

placing a component support fixture over the components, the component support fixture comprising oversized compartments surrounding the components, the size chosen such that the compartments accommodate components of all sizes with the size range; wherein the component support fixture comprises vent holes to permit venting of air or excess insulating material;

pressing the component support fixture until it contacts the substrate;

patterning the metal foil to provide an electrical connection to the at least one lead through the anisotropic adhesive.

2. The process according to claim 1, further comprising pressing the component support fixture while the insulating material is still moldable thereby molding it.

* * * * *